United States Patent
Iijima (10) Patent No.: US 7,476,971 B2
(45) Date of Patent: Jan. 13, 2009

(54) VIA LINE BARRIER AND ETCH STOP STRUCTURE

(75) Inventor: Tadashi Iijima, Kawasaki (JP)

(73) Assignee: Toshiba America Electronic Components, Inc., Irvine, CA (US)

(*) Notice: Subject to any disclaimer, the term of this patent is extended or adjusted under 35 U.S.C. 154(b) by 0 days.

(21) Appl. No.: 11/382,924

(22) Filed: May 11, 2006

(65) Prior Publication Data

US 2007/0264817 A1 Nov. 15, 2007

(51) Int. Cl.
H01L 23/52 (2006.01)

(52) U.S. Cl. .............. 257/758; 257/211; 257/762; 257/774

(58) Field of Classification Search ............ 438/622, 438/627, 628, 643, 644, 637; 257/793, 774, 257/104, 211, 758, 762
See application file for complete search history.

(56) References Cited

U.S. PATENT DOCUMENTS

| | | | |
|---|---|---|---|
| 6,159,871 A * | 12/2000 | Loboda et al. | 438/786 |
| 6,642,622 B2 | 11/2003 | Usui et al. | |
| 2002/0027286 A1* | 3/2002 | Sundararajan et al. | 257/751 |
| 2005/0161765 A1* | 7/2005 | Tsau | 257/528 |
| 2006/0001165 A1* | 1/2006 | Tokitoh et al. | 257/758 |
| 2006/0118955 A1* | 6/2006 | Liu | 257/753 |
| 2006/0255463 A1* | 11/2006 | Won | 257/751 |
| 2006/0261478 A1* | 11/2006 | Thei et al. | 257/751 |

* cited by examiner

Primary Examiner—Fernando L Toledo
Assistant Examiner—Jae Lee
(74) Attorney, Agent, or Firm—Banner & Witcoff, Ltd.

(57) ABSTRACT

A semiconductor device and a method for making the semiconductor device having a barrier layer in a via hole region and a barrier layer in a via line region. The barrier layer in the via line region is initially thicker than the barrier layer in the via hole region, prior to being etched during an etching process due to varying selectivity of etching rates between the via hole region and the via line region.

16 Claims, 7 Drawing Sheets

VIA LINE BARRIER AND ETCH STOP STRUCTURE

BACKGROUND

Via hole structures are common and are used to vertically connect metal or metalized layers in semiconductor devices. Via line structures are also used to connect metal layers. In some instances, via line structures are used inside the active area of a chip; in other instances, they are used outside of the active area.

Figure 1:
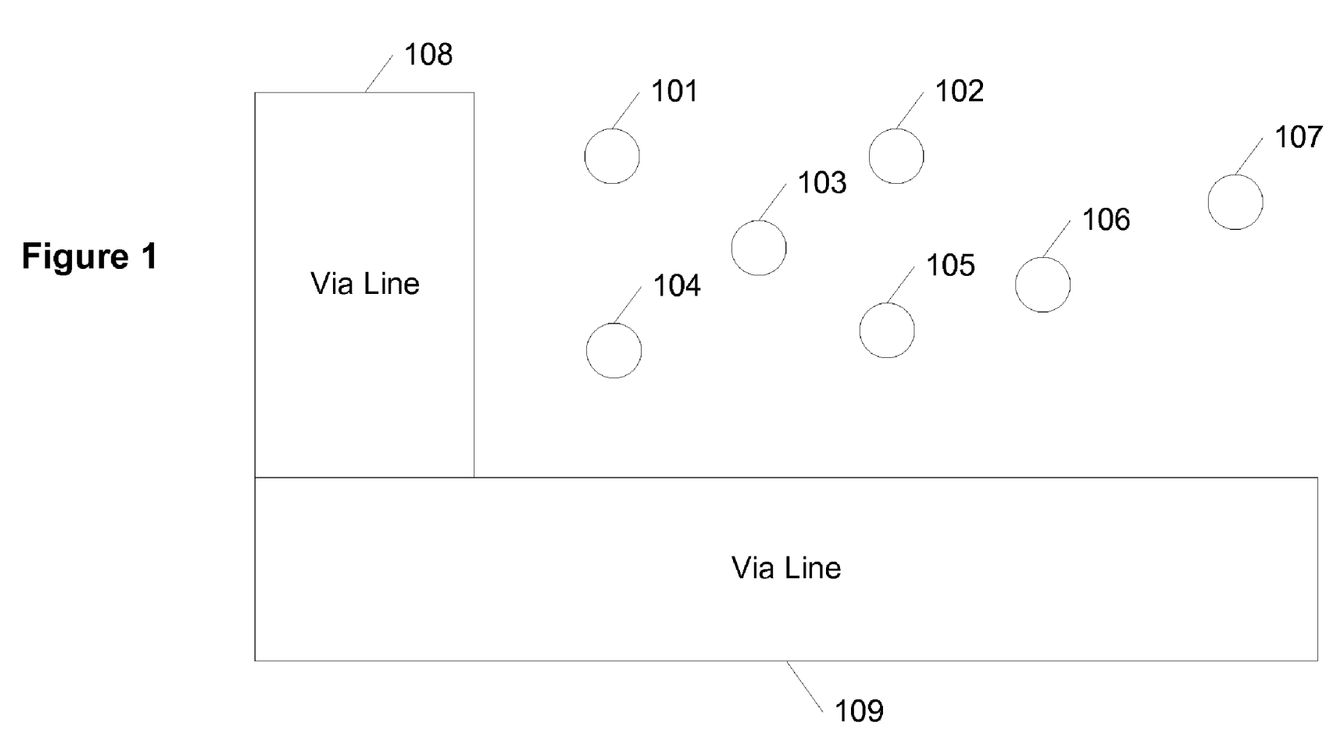
FIG. 1 shows a conventional via holes and via lines in a plan view.
Figure 2A:
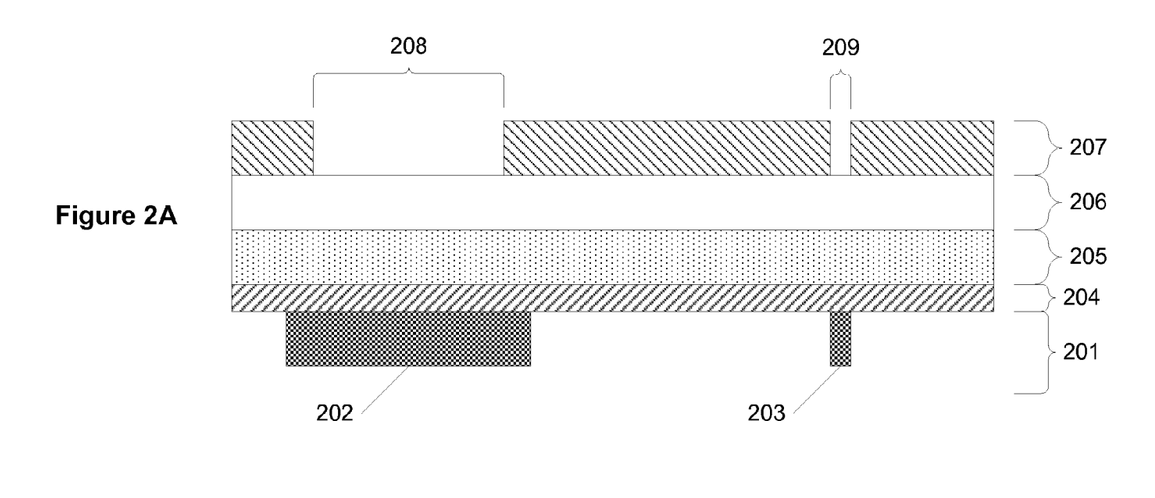
FIGS. 2A and 2B show a conventional technique for forming via holes and via lines.
Figure 2B:
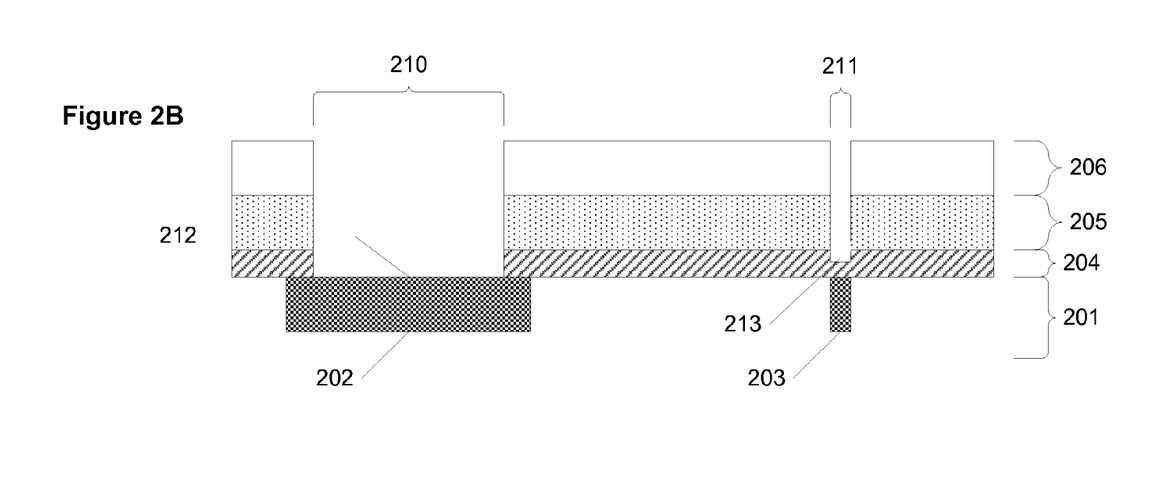

FIG. 1 shows via hole structures 101-107 used with via line structures 108-109 on the same chip. FIGS. 2A and 2B show a conventional process for creating both via hole and via line structures on the same chip. Referring to FIG. 2A, a substrate 201 includes metal lines (or metalized lines) 202 and 203 for contact using a via line and via hole, respectively. It is appreciated that substrate 201 is used for illustrative purposes only and the structure of 201 may occur on top of other layers, not necessarily as part of a substrate, per se. Accordingly, lines 202 and 203 are described as being a first structure 201.

A barrier layer 204 is commonly deposited on top of structure 201. The barrier layer 204 is used to prevent oxidation or corrosion or migration of the material in metal lines 202-203. Metal lines 202-203 may include copper, aluminum, titanium, tantalum and tungsten, and other metals as known in the art. The barrier layer 204 may include SiCN, although other etch stopping compounds can be used. A thick SiCN layer is sometimes helpful as it seals a metal or metalized surface from moisture, corrosion, and metal migration without significantly increasing an interconnect capacitance between a covered metal or metalized layer and the conductive material filling the via hole or via line, so as to make the interconnect unusable.

On top of barrier layer 204 is another layer, for instance, a SiOCH layer 205 (also referred to as a SiOCH layer). Topping layer 205 is an oxide layer (for instance, silicon oxide, SiOx) 206. On top of the oxide layer 206 is a patterned resist layer 207, having patterned aperture 208 for a via line and 209 for a via hole.

FIG. 2B shows the structure of FIG. 2A after etching. Here, an anisotropic etch (for instance, reactive ion etching) may be used to create openings for the via line 210 and via hole 211. Ashing may or may not be then used to remove the resist layer 207.

One of the issues associated with various etching techniques, including but not limited to RIE, is the variance in selectivity during the etching process. For instance, the rate of etching may to some degree be related to a minimum cross sectional dimension. This means that layer 204 may etch faster over a via line (with a minimum dimension commonly around 100 nanometers) than over a via hole (with a minimum dimension commonly around 10 nanometers in diameter).

FIG. 2B shows a result of the differing etch rates. Here, while layer 204 was properly removed over line 202, at least a part of it (portion 213) remains over hole 203, thereby preventing complete contact with the metal contact 203.

A process is needed that accounts for the differing etch rates for via lines compared to via holes in semiconductor devices.

SUMMARY

Aspects of the invention address one or more of the issues described above, thereby providing an improved process for forming via lines and via holes in semiconductor devices. A barrier layer or barrier layers over a contact for a via line region may be thicker (or more numerous) than a corresponding barrier layer or layers over a contact for a via hole region. This difference compensates for varying etching rates or selectivity based on respective sizes of the via hole and via line regions.

BRIEF DESCRIPTION OF THE DRAWINGS

The following provides descriptions of the various drawings.

FIGS. 4A-5C show a first process for making via hole and via lines in accordance with aspects of the present invention.

DETAILED DESCRIPTION

Aspects of the present invention relates to processes and structures for forming via lines and via holes in semiconductor devices.

It is noted that various connections are set forth between elements in the following description. It is noted that these connections in general and, unless specified otherwise, may be direct or indirect and that this specification is not intended to be limiting in this respect.

Figure 3A:
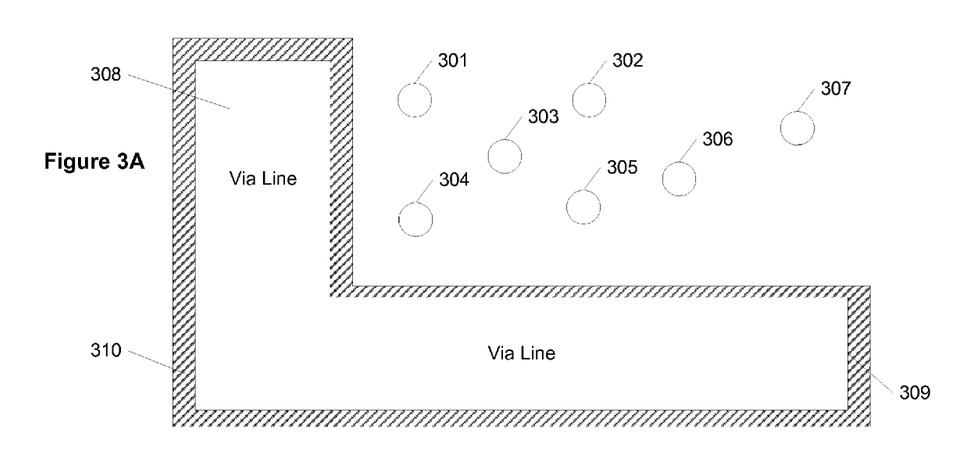
FIGS. 3A and 3B show views of a structure in accordance with aspects of the present invention for forming via holes and via lines.

FIG. 3A shows an illustrative example of a structure for forming via holes and via lines. Via holes 301-307 and via lines 308-309 are shown. FIG. 3A may optionally include an additional layer 308 of a buffer formed on top of metal lines reached by the via lines.

Figure 3B:
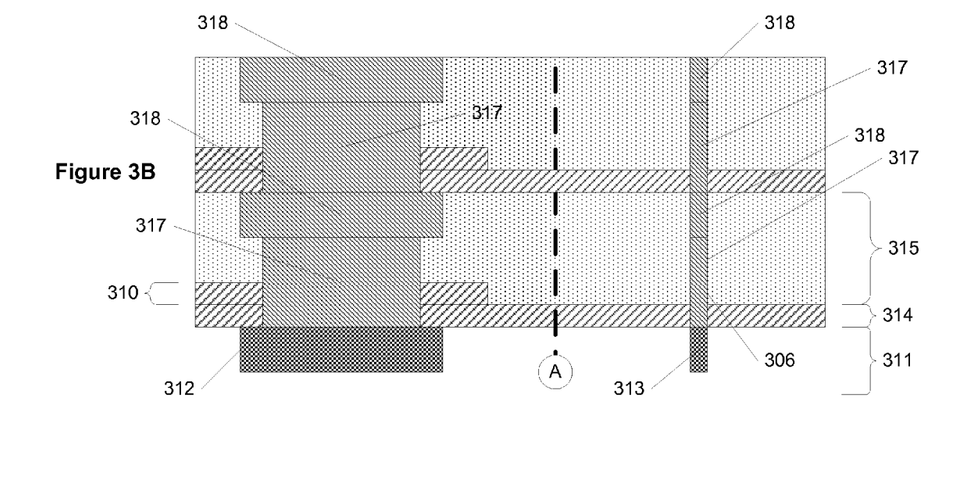

FIG. 3B shows a completed via line and via hole structure. FIG. 3B show a structure 311 with metal or metalized lines 312 and 313. Next is barrier layer 314 for both via holes and via lines. Over the via line sections is an additional barrier layer 310. Covering the barrier layer (or layers, not shown) is layer or layers 315. Layer or layers 315 may or may not include a SiOCH layer. Via holes 306 and via lines 308 are filled with a plug material 317 (for instance, tungsten or any other plug material) and capped by metal or metalized contacts 318.

In one example, layer 310 may be at least 50% more than the thickness of layer 314. This thickness difference may be adjusted up or down based on the resulting etch rate selectivity differences between the etching in the via line region compared against that in the via hole region.

The thickness of layer 314 (for instance, a SiCN layer) may be greater than 100 angstroms to be effective in stopping corrosion of metal or metalized lines 312 and 313. This value may be adjusted to account for via line and via hole sizes. For instance, smaller holes and smaller lines may work well with thinner SiCN layers. As an example, layer 314 may be 350 angstroms in thickness. Layer 310 may be 150 angstroms thick, resulting in a total layer thickness of 500 angstroms in the via line region and 350 angstroms in the via hole region. Here, the percentage difference between 150 angstroms and 350 angstroms is 42.8%.

The distances of overlap between the width of the via hole and via line and the metal or metalized lines 312 and 313 may vary. Also, layer 310 may extend beyond the width of the via line dimension by some amount. The amount may be 0 angstroms in some situations. The amount may always be greater than 10 angstroms in others. Here, the amount of overlap may be dependent on the etch rate selectivity and to the degree that etching on the sides of the via line regions may occur, where the overlap of region 310 is to stop the etching into the metal or metalized line 312 around the sides of layer 310. It is appreciated that the degree of overlap may vary based on the size of the minimum dimension of the via line region: larger minimum dimensions may include the use of a higher overlap (more than 15 angstroms) and smaller minimum dimensions may include the use of less to no overlap (less than 5 angstroms).

The following figures describe the formation of the various layers of one or more aspects of the present invention.

Figure 4A:
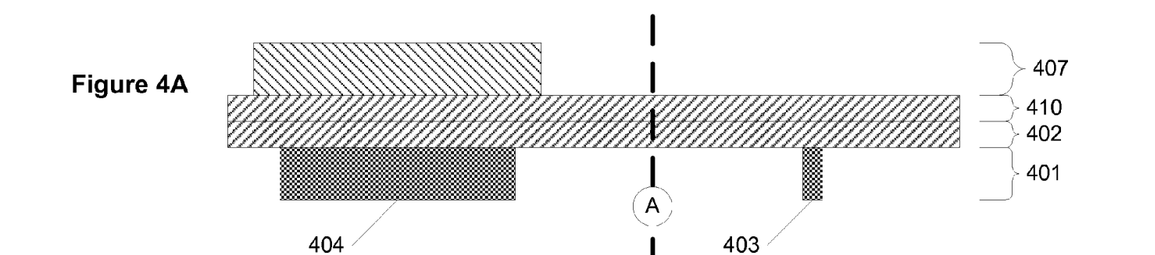
Figure 4B:
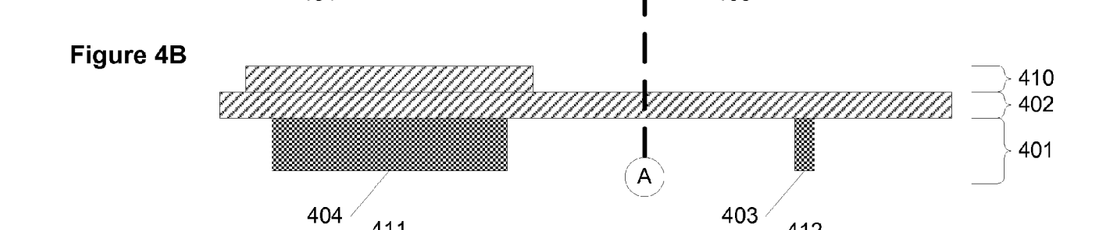
Figure 4C:
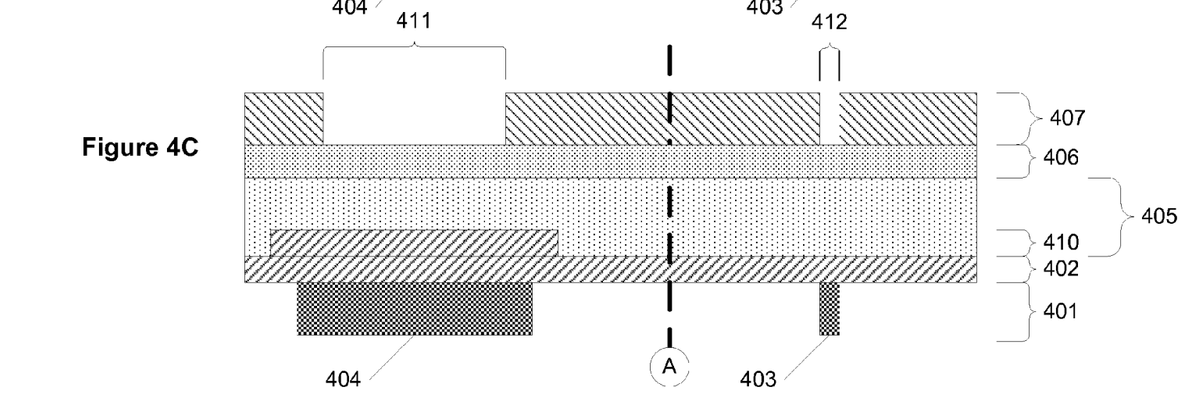

FIGS. 4A and 4B and 4C show a first process and structure for providing a trench for a via line and hole for a via hole. Referring to FIG. 4A, structure 401 includes metal or metalized lines 403 and 404. Structure 401 is covered by barrier layer 402 (for example, SiCN) and by another barrier layer 410 (also for example, SiCN). A resist layer is deposited and patterned 407.

FIG. 4B shows layer 410 having been etched back and patterned resist layer 407 removed.

FIG. 4C shows additional layers added to the structure of FIG. 4B. In particular, layer 405 (which may be a SiOCH layer) may be deposited. The next layer may include an oxide layer 406 (for example, a silicon oxide layer), upon which is formed a resist layer 407 with apertures 411 and 412. The layers may be deposited and/or grown through standard techniques.

Figure 5A:
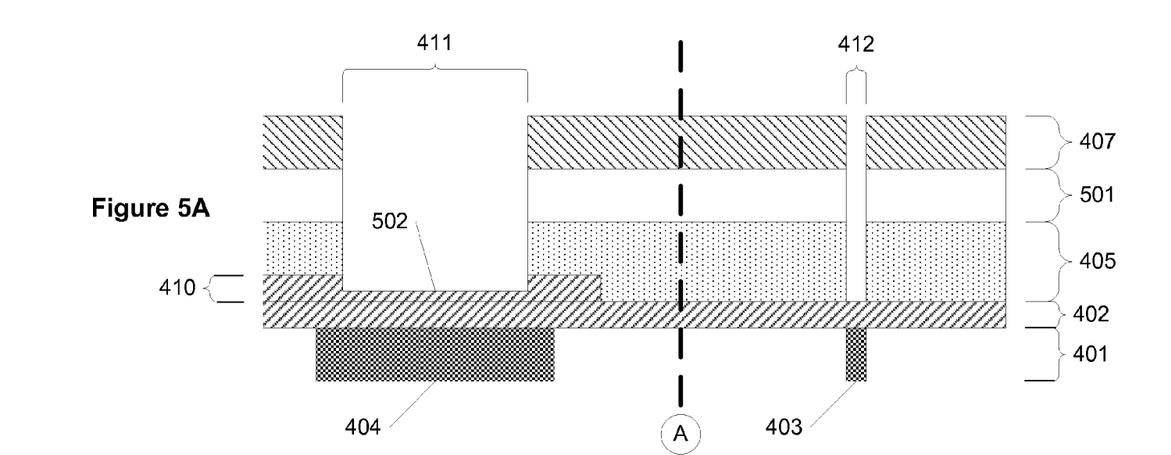

FIG. 5A shows the structure of FIG. 4C having been etched (for example, by RIE) to remove the material of layer 405 (possibly a SiOCH layer), resulting in trenches 411 and 412 for the via line and via hole, respectively. Here, the two barrier layers 402 and 410 prevented the etching process from penetrating through to metal or metalized line 404 and 403. It is noted that via line 411 includes a double layer of barrier layer (402 and 410).

The following describes two situations where the etching of layer 405 of FIG. 4A may vary: etching differences between via hole and via line regions for a specific chip and etching differences across a wafer.

1. Etching Differences Between Via Hole and Via Line Regions

With respect to etching between via hole and via line regions, in some situations, the RIE etch to remove relevant sections of layer 405 may also etch into barrier layer or layers 402 and 410. The RIE etch for layer 405 may, in some situations, be more active in via line regions than in via hole regions. FIG. 5A shows an example where the RIE etch for layer 405 removed all of layer 405 in via hole region 412. However, because of the varying etch rates for via hole and via line regions, the RIE etch for layer 405 continued to etch into layer 410 of via line region 411. The result is at least a partial removal of barrier layer 410 as shown by the new surface 502 of barrier layer 410. Depending on the degree of etching, the RIE etch for removal of layer 405 may etch a partial amount of barrier layer 410 or all the way through layer 410 to the surface of layer 402 (and possibly into barrier layer 402). Additionally, there may or may not be some etching of layer 402 in the via hole region as well from the RIE etch to remove layer 405.

2. Etching Across Wafer

With respect to etching across chips on a wafer, variations may occur across a wafer including but not limited to varying etch rates and layer thicknesses across the wafer. In some situations, additional etching may be required to ensure that the RIE etch to remove layer 405 has, for all chips, completely removed layer 405 in the via hole and via line regions. In an additional example, the RIE etch for removing layer 405 may be continued to allow for the etch to remove layer 410 to the surface of layer 402 in the via line region for all chips. For example, to ensure the RIE etch of layer 405 has etched through layer 410 to the surface of layer 402 in all via line regions, etching time may be increased by 20%. The 20% increase in etch time to ensure complete etching across a wafer is typical. It is appreciated that the etch time increase may be varied (increased or decreased) according to operational conditions, structure complexity, and/or other conditions known in the art.

Continuing with FIG. 5A, the structure of FIG. 5A may be ashed to remove the photoresist layer 407. The structure may be subjected to an RIE SiCN etch to etch through the SiCN layers 402 and 410. Because of the faster etching in the via line region 411 matched with the additional layer of SiCN 410, the etching time required to etch through the SiCN in the via line region 411 can be made to approximately match the etching time needed to etch through the SiCN in the via hole region 412. This has the effect of the SiCN etching through the SiCN to the surface of the metal or metalized lines 403 and 404, without significantly etching into them. The resulting structure is shown in FIG. 5B.

Figure 5B:
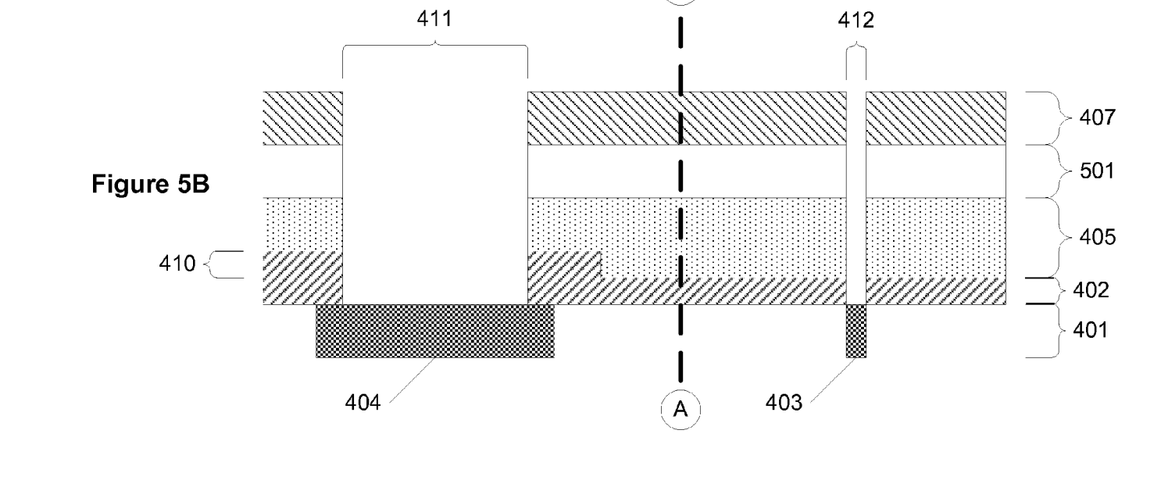

The following charts explain the distinctions of the results of etching between the etching of conventional layers in FIG. 2B and etching of the layers of FIG. 5B.

| Type of Region | Barrier Layer of FIGS. 2A-2B | RIE Etching Rates (pre-barrier layer etch and barrier layer etch) | Effect of RIE Etches |
| --- | --- | --- | --- |
| Via Line Region | Same thickness barrier layer in via hole and via line regions | Faster than via hole etch rate | Combined faster etch rates etch through via line region barrier layer before via hole region barrier layer |
| Via Hole Region | Same thickness barrier layer in via hole and via line regions | Slower than via line etch rate | Some of barrier layer in via hole region remains |

| Type of Region | Barrier Layer of FIGS. 5A-5B | RIE Etching Rates (pre-barrier layer etch and barrier layer etch) | Effect of RIE Etches |
| --- | --- | --- | --- |
| Via Line Region | Thicker barrier layer/additional barrier layer in via line regions | Faster than via hole etch rate | Combined faster etch rates etch through thicker/additional barrier layers in same time as etching through thinner/fewer barrier layers in via hole regions |
| Via Hole Region | Thinner/fewer barrier layers in via hole regions | Slower than via line etch rate | Barrier layers removed in both via hole and via line regions |

Figure 5C:
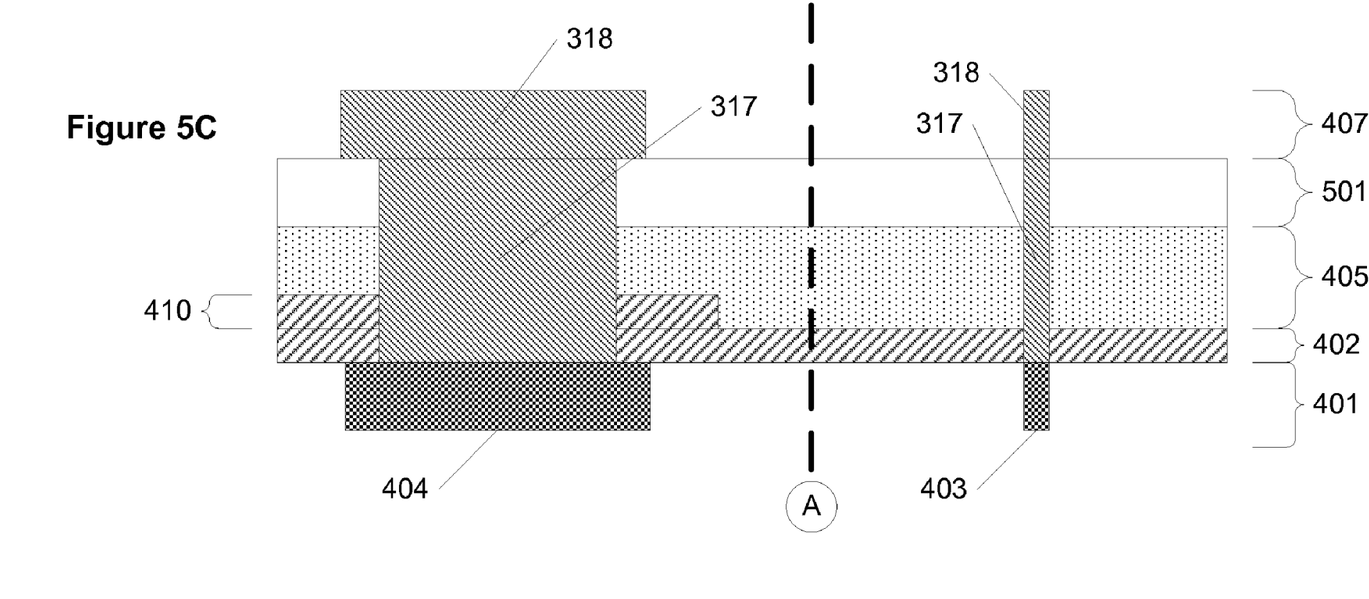

Next, the structure of FIG. 5B may be further processed. The via line and via hole regions maybe filled and capped with conventional materials 317 and 318 (including but not limited to tungsten), thereby providing via holes and via lines. The resulting structure is shown in FIG. 5C.

Figure 6A:
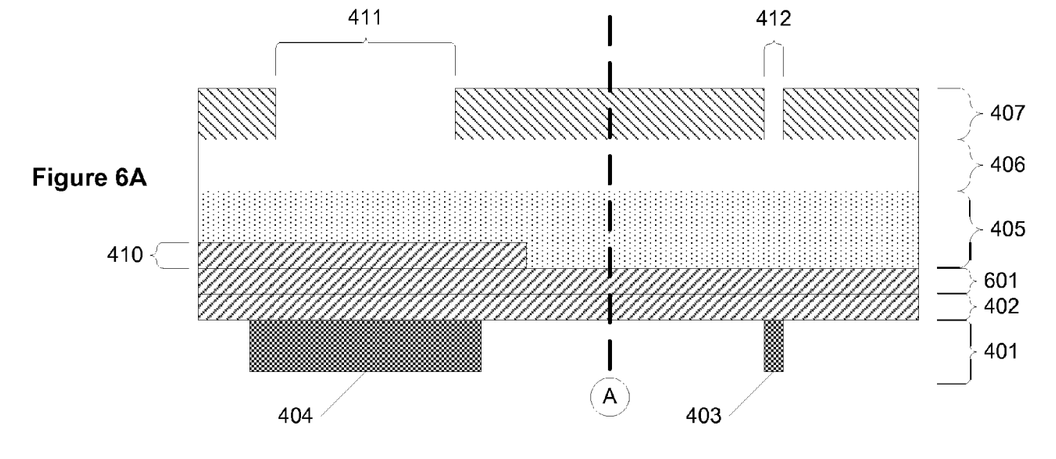
FIGS. 6A and 6B show a second process for making via holes and via lines in accordance with aspects of the present invention.
Figure 6B:
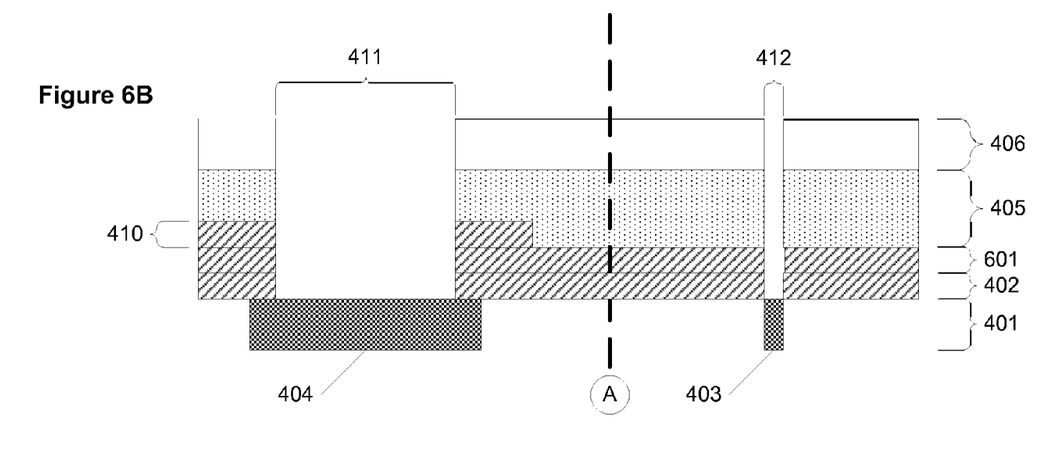

FIGS. 6A and 6B show another process for adjusting the thickness of SiCN layers to account for varying etch rates in the via hole and via line regions. Similar to the structure of FIGS. 4A-4C, FIG. 6A includes an extra SiCN layer 601. This layer can be used in situations where the via holes are larger (or the via lines are narrower), thereby providing effective etching times that are closer where using only a single barrier layer for via hole regions and double barrier layers for via line regions. FIG. 6B shows the result of ashing of resist layer 407, etching through layer 405 (which may or may not include SiOCH), and a SiCN etch through layers 402, 410, and 601 to metal or metalized lines 403 and 404.

FIGS. 6A and 6A represent that any number of barrier layers can be used. Additional layers or fewer layers for via line 411 compared to the via hole 412 allow for fine tuning the SiCN etching process so that consistent and reliable etching of the SiCN layer (or layers) occurs.

It is appreciated that the different number of barrier layers between the via line and via hole regions may be replaced or augmented with thicker or thinner barrier layers between the various regions.

It is appreciated that the figures described above show the layers as continuous between the via hole and via line regions. This has been done for simplicity of illustrations. In most situations, the layers may be disconnected or deposited at different times. For instance, the layers may be separated by other structures or distances as shown by broken line A in FIGS. 3B, 4A, 4B, 4C, 5A, 5B, 6A, and 6B.

I claim:

1. A semiconductor device comprising:
    a via hole region;
    a via line region separated from the via hole region;
    a first metal or metalized line under said via hole region; and
    a second metal or metalized line under said via line region,
    a first barrier layer on said first metal or metalized line and on said second metal or metalized line,
    a second barrier layer on said first barrier layer over said second metal or metalized line, but not over said first metal or metalized line,
    wherein said via hole region was etched through said first barrier layer,
    wherein said via line region was etched through said second barrier layer and through said first barrier layer on said second metal or metalized line, and
    wherein said second barrier layer includes an overlapping portion surrounding said via line region.

2. The semiconductor device according to claim 1, wherein said overlapping portions of said second barrier layer were originally part of a third barrier layer that was etched during an etching process.

3. The semiconductor device according to claim 1, wherein said first metal or metalized line is copper and said second metal or metalized line is copper.

4. The semiconductor memory device according to claim 1, wherein said first barrier layer is SiCN and said second barrier layer is SiCN.

5. The semiconductor memory device according to claim 1, further comprising:
    a third barrier layer in both said via hole region and said via line region, said third barrier having been etched through during an etching process.

6. The semiconductor memory device according to claim 1, further comprising:
    a SiOCH layer above said first barrier layer and above said second barrier layer.

7. The semiconductor memory device according to claim 6, further comprising:
    a silicon oxide layer above said SiOCH layer.

8. A process for forming a semiconductor device comprising the steps of:
    forming first lines and second lines in a structure, the second lines being separated from the first lines;
    forming a first barrier layer on said first lines and said second lines;
    forming a second barrier layer on said first barrier layer over said first lines but not over said second lines;
    forming additional layers over said first and second barrier layers;
    depositing and patterning a resist to include apertures for via line regions and for via hole regions, the via line regions corresponding to the first lines, and the via hole regions corresponding to the second lines;
    etching via holes and via lines through said patterned resist, said etching step comprising performing etching through said first barrier layer and said second barrier layer for said via line regions at the same time as performing etching through said first barrier layer for said via hole regions; and
    filling said via lines and said via holes.

9. The process according to claim 8, said forming said first lines includes forming copper lines.

10. The process according to claim 8, said forming said first barrier layer includes forming a SiCN layer.

11. The process according to claim 8, said forming said second barrier layer includes forming a SiCN layer.

12. The process according to claim 8, said forming additional layers includes forming a SiOCH layer.

13. The process according to claim 8, said forming additional layers includes forming a silicon oxide layer.

14. The process according to claim 8, wherein said etching through said first and second barrier layers over said via line regions is a same time as etching through said first barrier layer over said via hole region while etching at a faster rate through said apertures in said resist for via line regions than through said apertures in said resist for via hole regions.

15. The process according to claim 8, said forming said first barrier layer includes forming multiple barrier layers.

16. A semiconductor device, comprising:
    a first metal or metalized line;
    a second metal or metalized line separated from the first metal or metalized line;
    a first barrier layer disposed on the first metal or metalized line and the second metal or metalized line;
    a second barrier layer disposed on the first barrier layer over the first metal or metalized line but not over the second metal or metalized line;
    a via line formed through the first barrier layer and the second barrier layer; and
    a via hole formed through the first barrier layer.

* * * * *